United States Patent
Zagdoun

(10) Patent No.: US 7,230,189 B2
(45) Date of Patent: Jun. 12, 2007

(54) ELECTROMAGNETIC SHIELD STRUCTURE

(75) Inventor: Georges Zagdoun, La Garenne Colombes (FR)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 10/559,841

(22) PCT Filed: Jun. 9, 2004

(86) PCT No.: PCT/FR2004/001429

§ 371 (c)(1),
(2), (4) Date: Dec. 7, 2005

(87) PCT Pub. No.: WO2005/004574

PCT Pub. Date: Jan. 13, 2005

(65) Prior Publication Data

US 2006/0254816 A1    Nov. 16, 2006

(30) Foreign Application Priority Data

Jun. 13, 2003  (FR) .................................. 03 07122

(51) Int. Cl.
*H05K 9/00* (2006.01)
(52) U.S. Cl. ...................................... 174/389; 313/112
(58) Field of Classification Search .............. 174/381, 174/389; 313/112
See application file for complete search history.

(56) References Cited

U.S. PATENT DOCUMENTS 4,381,421 A * 4/1983 Coats et al. ................. 174/371

FOREIGN PATENT DOCUMENTS

| EP | 0 930 637 | 7/1999 |
|---|---|---|
| EP | 0 977 167 | 2/2000 |
| EP | 1 196 018 | 4/2002 |

* cited by examiner

*Primary Examiner*—Hung V. Ngo
(74) *Attorney, Agent, or Firm*—Oblon, Spivak, McClelland, Maier & Neustadt, P.C.

(57) ABSTRACT

An electromagnetic shielding structure including at least a first transparent substrate, a conducting element, optionally a transparent backing sheet and a transparent tie sheet and a transparent additional sheet or covering sheet, and an electrical connector configured to be connected to the conducting element to ground the conducting element. At least one of the backing sheet, the tie sheet or the additional sheet or covering sheet, when present, is, at least on one of its sides, placed set back toward the interior of the structure relative to the associated free edge of the transparent substrate so as to leave a portion exposed on at least one of the faces of the conducting element, the connector being placed against and/or connected to this exposed portion.

11 Claims, 2 Drawing Sheets

ELECTROMAGNETIC SHIELD STRUCTURE

FIELD OF THE INVENTION

The subject of the invention is an electromagnetic shielding structure, the invention relating more particularly to the electrical grounding of this structure.

DISCUSSION OF THE BACKGROUND

An electromagnetic shielding structure is, for example, used in a display, such as a plasma display.

A plasma display has a plasma gas mixture (Ne, Xe, Ar) trapped between two glass plates, and phosphors placed on the internal face of the rear plate of the display. Ultraviolet light radiation emitted by the plasma gas mixture during the plasma discharge between the two glass plates interacts with the phosphors on the internal face of the rear plate in order to produce the visible light radiation (red, green or blue). A gas particle deexcitation mechanism competes with the UV emission, which generates infrared radiation between 800 and 1250 nm, the propagation of which radiation, mainly through the front face of the display, may be the source of very troublesome interference, especially as regards equipment located nearby and controlled by infrared, for example by means of remote controls.

Moreover, like all electronic apparatus, plasma displays possess addressing systems (drivers) that may generate parasitic radiation which must not interfere with other devices, such as microcomputers, mobile telephones, etc.

To eliminate, or at the very least attenuate, the propagation of such radiation, one solution consists in placing against the front face of the display a structure that is both transparent and metallized in order to provide electromagnetic shielding.

Figure 1:
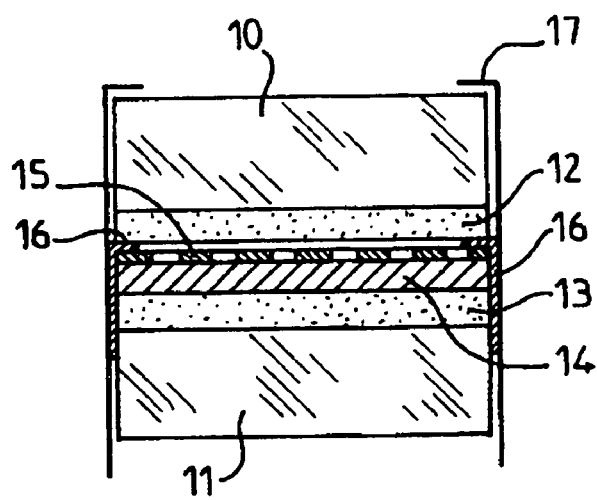

A known example of a shielding structure, as illustrated in FIG. 1, comprises two glass substrates 10 and 11 between which two PVB thermoplastic sheets 12 and 13 and a PET sheet 14 are sandwiched, a copper mesh 15, constituting the conducting element for electromagnetically shielding the structure, being deposited by photolithography on the PET sheet 14, the latter being sandwiched between the two PVB sheets 12 and 13. The electrical connection of the copper mesh to ground is performed by means of flat conductors, such as busbars 16, soldered on one side to the copper mesh 15 and connected, on the other side, to a grounded metal frame 17. This metal frame constitutes the frame of the display and serves as support for the shielding structure associated with the display.

To keep the flat conductors 16 in position, for the purpose of soldering them to one of the faces of the copper mesh 15, the conductors form a return over the edge of the PET sheet 14 and the soldering takes place while the PET sheet and the PVB sheets are being joined together by heating the thermoplastics.

However, improper handling of the PVB sheets and/or incorrect joining of the PVB sheets to the PET sheet with the conductors may result in defects in the structure, such as blisters between the plastic sheets. Such defects are visible to the naked eye and such a product therefore cannot be used in displays.

In addition, the operation of folding the flat conductors over the edge of the PET sheet and of bonding them thereto, in a suitable manner and without any defects, in order to form the returns, is not a rapid step in an industrial manufacturing process. Furthermore, if this folding-over is poorly implemented, it may result in a breakage at the corner of the returns.

Consequently, the joint dependence of the electrical connection means, consisting of the flat conductors, on the conducting shielding element and on the PET backing sheet of the conducting shielding element does not allow the shielding structure to be easily manufactured.

SUMMARY OF THE INVENTION

The object of the invention is therefore to alleviate these drawbacks by proposing an electromagnetic shielding structure that allows simpler connection of the conducting element of the structure to the electrical ground, for example the display with which said structure is associated.

According to the invention, the electromagnetic shielding structure comprising at least a first transparent substrate, a conducting element deposited on a transparent plastic backing sheet or else deposited on the first substrate, and a transparent plastic tie sheet that ties the conducting element to the substrate by the backing sheet being joined to the tie sheet, or else that covers the conducting element when the latter is deposited directly on the substrate, it being possible for a transparent additional sheet or covering sheet to be optionally joined to the backing sheet against the opposite face to the face joined to the tie sheet or else possibly being optionally joined to the tie sheet when the conducting element is deposited directly on the substrate, electrical connection means being intended to be connected to the conducting element in order to ground the latter, is characterized in that one at least of the backing sheet, the tie sheet or the additional sheet or covering sheet, when it is present, is, at least on one of its sides, placed set back toward the interior of the structure relative to the associated free edge of the transparent substrate so as to leave a portion exposed on at least one of the faces of the conducting element, the connection means being placed against and/or connected to this exposed portion.

What are called the faces of the conducting element are the surfaces that extend over the largest dimensions.

In a first embodiment, the structure, with the conducting element deposited on the backing sheet, is characterized in that the element is sandwiched between the tie sheet and the backing sheet, and at least the tie sheet is, on at least on of its sides, placed so as to be set back relative to the associated free edge of he transparent substrate so as to leave space for a free part of the transparent substrate and for an exposed portion of the conducting element, this free part facing the exposed portion of the conducting element, and in that the connection means are fastened by adhesive bonding to the free part of the substrate and are connected via electrical bonding means to that exposed portion of the conducting element facing the free part.

According to a second embodiment, the structure, with the conducting element deposited on the backing sheet, is characterized in that the conducting element is sandwiched between the tie sheet and the backing sheet, and at least the backing sheet and, when it is present, the additional sheet are, at least on one of their sides, placed set back relative to the associated free edge of the transparent substrate so as to leave space for an exposed portion of the conducting element, and in that the connection means are fastened by adhesive bonding and/or by mechanical crimping to the exposed portion of the conducting element.

According to a third embodiment, the structure, with the conducting element deposited on the backing sheet and including the covering sheet, is characterized in that the conducting element deposited on the backing sheet is placed opposite the tie sheet and sandwiched between the backing sheet and the covering sheet, the covering sheet being, at least on one of its sides, set back toward the interior of the structure relative to the associated free edge of the transparent substrate in order to leave space for an exposed portion of the conducting element, and in that the connection means are fastened by adhesive bonding and/or by mechanical crimping to the exposed portion of the conducting element.

According to a fourth embodiment, the structure the conducting element is deposited on the substrate, is characterized in that at least the tie sheet and, when it is present, the covering sheet are, on at least one of their sides, set back toward the interior of the structure relative to the associated free edge of the transparent substrate in order to leave the exposed portion of the conducting element accessible, and in that the connection means are fastened by adhesive bonding and/or by mechanical crimping to the exposed portion of the conducting element.

According to one feature, the conducting element is a silver-based metal layer. As a variant, the conducting element consists of a mesh of conducting wires, preferably copper wires.

According to another feature, the connection means consist of a flat conductor such as a busbar or a conductive foam tape.

Advantageously, all of the periphery of the first substrate of the face situated toward the interior of the structure or else the free part of said first substrate is covered with an enamel.

Preferably, the exposed portion corresponds, in the manner of a frame, to the entire periphery of one of the faces of the conducting element.

According to another feature, the backing sheet is made of a plastic, for example PET or one based on one of the following materials: polycarbonate, polymethyl (meth)acrylate, polyethersulfone, polyetherketone and styrene-acrylonitrile copolymers. Moreover, the tie sheet, the additional sheet and the covering sheet are made of a plastic, such as polyvinyl butyral, polyurethane or ethylene-vinyl acetate.

In its use, the structure is, for example, fitted into a frame, the inner part of which is metallic, the connection means pressing against said inner part.

Finally, the structure may be joined to the front face of a display, such as a plasma display, and connected to the electrical ground of this display.

Other advantages and features of the invention will now be described in greater detail in conjunction with the appended drawings in which:

FIG. 1 is a sectional view of an electromagnetic shielding structure for a display according to the prior art; and FIGS. 2, 3a, 3b, 4a, 4b and 5 are sectional views of an electromagnetic shielding structure according to four embodiments of the invention respectively.

Illustrated in FIGS. 2, 3a, 3b, 4a, 4b and 5 by way of non limiting examples are four embodiments of an electromagnetic shielding structure 2 intended for example to be joined to the front face of a display (not illustrated here), such as a plasma display. Shown partially is just the frame 5 of the display into which the shielding structure 2 is fitted. The invention provides the electrical connection of the shielding structure to the electrical ground of the display.

For more details about the embodiments of the shielding structure and their variants, the reader may refer to French patent application FR 03/04636.

The shielding structure 2 comprises at least a first transparent substrate 20, preferably of the glass type, optionally a second transparent substrate 21 of the glass type, and a conducting electromagnetic shielding element 30 associated with the first substrate. Electrical connection means 40 are attached and intended to electrically connect the conducting element 30 to a conducting part 50 of the display, such as the metal interior of the frame 5 that supports the shielding structure for joining it to the display, the metal inner part 50 being intended to be connected to the ground of the display.

The shielding structure 2 is thus placed in the frame 5 intended to be joined to the display by standard mechanical fastening means. The first glass substrate 20 is intended to face the viewer, this first substrate being defined in the rest of the description as the front side of the structure, whereas the second substrate 21 is intended to face the display, i.e. on the rear side of the structure.

Advantageously, the first substrate 20 is made of toughened glass, in order to withstand impacts, and has, on its external face on the side facing the viewer, an antireflection coating.

The conducting element 30 consists, for example, of a mesh of metal wires, advantageously copper wires, said mesh being deposited on a transparent plastic backing sheet 31, for example made of PET or one based on one of the following materials: polycarbonate, polymethyl (meth)acrylate, polyethersulfone, polyetherketone and styrene-acrylonitrile copolymers.

As a variant, the conducting element 30 may instead be a metal coating, such as one based on silver, deposited on the plastic backing sheet 31 or else deposited directly on the internal face of the substrate 20 facing the interior of the structure.

The structure 2 also includes a transparent tie sheet 22 made of a plastic, such as polyvinyl butyral or polyurethane or ethylene-vinyl acetate, placed against the first substrate 20.

The tie sheet 22, when the conducting element 30 is attached to the backing sheet 31, ties the conducting element to the first substrate 20 by the backing sheet 31 of the conducting element being joined to said tie sheet 22 after heating the plastics.

When the conducting element 30 is deposited directly on the substrate 20, the tie sheet 22 in particular ties the substrate to any other element.

Unlike the prior art, for which the electrical connection of the conducting shielding element is made by flat conductors that depend and cover the edges of the conducting element and of the backing sheet (FIG. 1), the connection according to the invention is obtained as will be explained, directly on one of the faces of the conducting element and attaching thereto the connection means after the structure has been manufactured.

Figure 2:
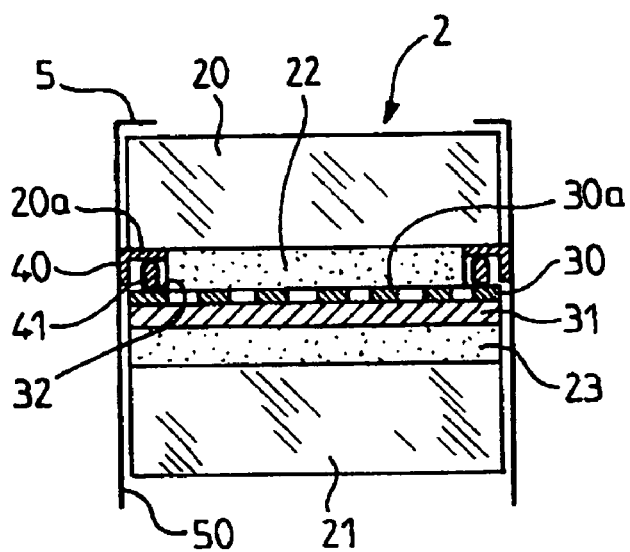

In the embodiment illustrated in FIG. 2, the tie sheet 22 does not extend back to the edges of the first glass substrate 20 but is set back toward the interior of the structure so as to leave space for a free part 20a advantageously over the entire internal periphery of the glass substrate, this free part of the substrate preferably being covered with black enamel.

The connection means 40 are fixed to this free part 20a and extend over the inner conducting part 50 of the frame 5. The connection means 40 consist, for example, of a busbar, for example fixed by adhesive bonding, on this free part 20a of the periphery of the glass substrate, the black enamel concealing these connection means when viewed from the outside.

As regards the conducting element 30 positioned on the backing sheet 31 and facing the tie sheet 22, this extends beyond the tie sheet 22 so that a portion 32 of its face 30a that faces the tie sheet 22 is positioned opposite the free part 20a to which the connection means 40 are fixed. The portion 32 preferably corresponds to the entire periphery of one of the faces, here the face 30a, of the conducting element. The electrical bonding between the connection means 40 and the portion 32 of the conducting element facing the connection means is provided by any suitable electrical bonding means 41, for example a layer of conductive adhesive or a conductive adhesive tape of the copper type.

In this embodiment, the structure includes the second glass substrate 21, which has dimensions equivalent to the backing sheet 31. It is joined to the backing sheet via an additional sheet 23 of plastic, such as PVB, with dimensions equivalent to those of the backing sheet 31 and of the glass substrate 21.

As a variant (but not illustrated), it is possible for the structure not to have a second glass substrate, and the backing sheet 31 then directly forms the rear face that is intended to be joined to the display.

Figure 3A:
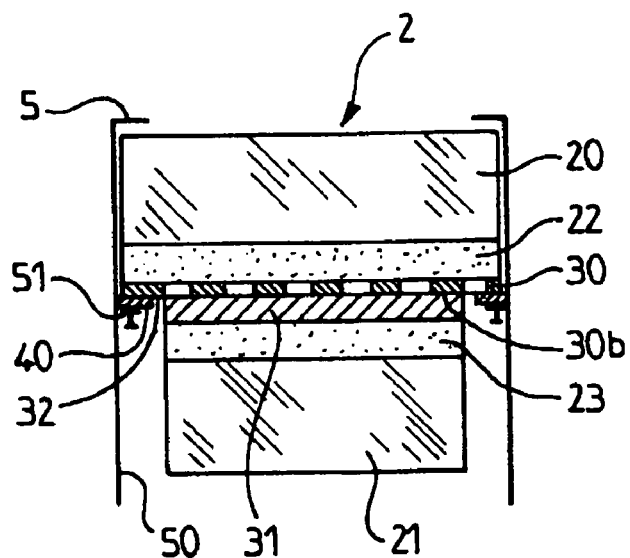
Figure 3B:
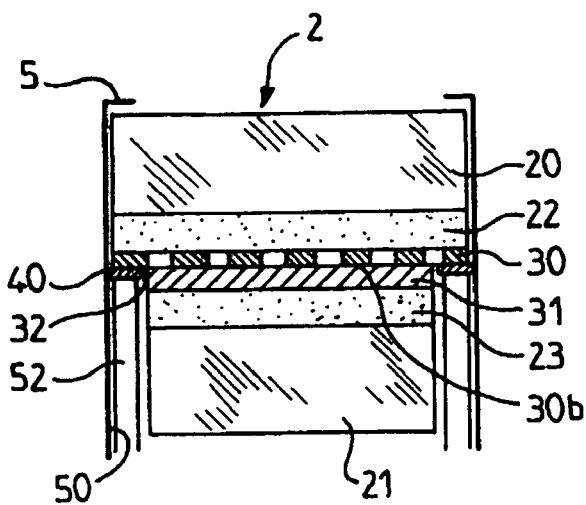
Figure 4A:
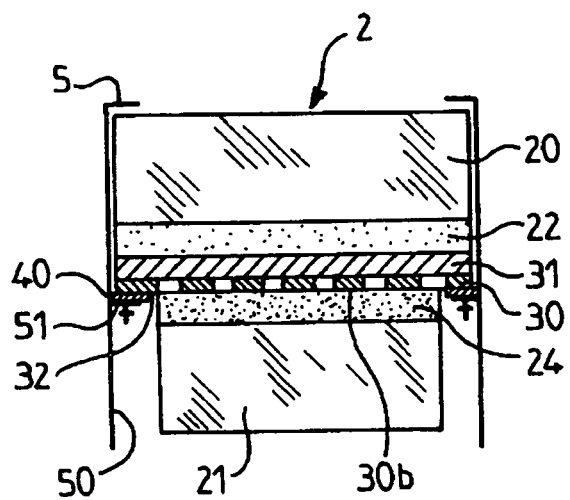
Figure 4B:
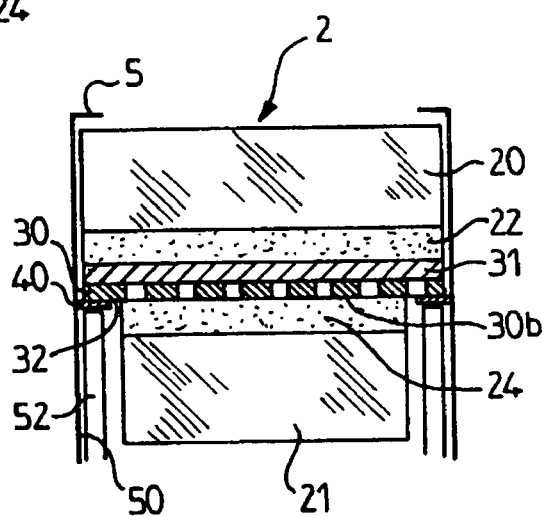
Figure 5:
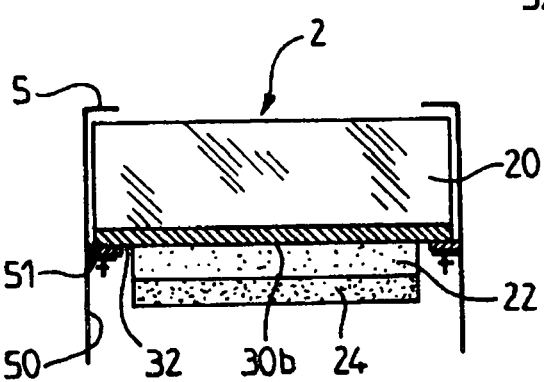

In the second embodiment, illustrated in FIGS. 3a and 3b, for which the conducting element 30 remains sandwiched between the backing sheet 31 and the tie sheet 22, it is unnecessary for the tie sheet 22 to be reduced in area relative to the first glass substrate. On the other hand, the backing sheet 31 is set back relative to the conducting element so as to leave exposed a portion 32 of its face 30b, this face being joined to the backing sheet 31. This portion 32, which preferably corresponds to the entire periphery of the face 30b, is then directly accessible from the rear of the structure in order for the connection means 40 to be applied and mechanically pressed thereon.

The connection means 40 may for example consist of a busbar. This busbar is, for example, pressed against the portion 32 of the face 30b of the conducting element by the clamping of a metal tab 51 integral with the electrical grounding frame 5 (FIG. 3a), or else to be pressed against the portion 32 by a part 52 of the frame of the display, which will be inserted between the structure and the conducting part 50 of the frame (FIG. 3b). The mechanical clamping of the connection means 40 is in fact performed by any suitable means within the competence of a person skilled in the art.

As a variant, the connection means 40 may consist of a conductive foam that is adhesive, in order to fasten the portion 32 of the conducting element to the conducting part 50 of the frame, this foam being deposited by an extrusion or injection-molding technique.

In this second embodiment, the second glass substrate 21, which is fastened to the backing sheet 31 via an additional sheet 23 of plastic, such as PVB, has the dimensions of the additional sheet and of the backing sheet.

As a variant (but not illustrated) and as in the first embodiment, it is possible for the structure not to include a second glass substrate 21, and the backing sheet 31 therefore directly constitutes the rear face that is intended to be joined to the display.

In the third embodiment (FIGS. 4a and 4b), the conducting element 30 is placed, not so as to be sandwiched between the tie sheet 22 and the backing sheet 21, but on the opposite side of the tie sheet 22. In this case, the structure 1 furthermore includes a transparent covering sheet 24 made of plastic, such as PVB. This covering sheet 24 is placed against the conducting element 30 so as to form a protective layer. In addition, it ties the conducting element 30 to the second substrate 21 by said covering sheet being joined to said substrate.

This arrangement of the conducting element 30 placed on the rear side of the structure, and therefore on the opposite side from the viewer, means that the PET backing sheet 31 is placed on the same side as the viewer. When the conducting element is a copper mesh, the bonding interface between the mesh and the PET has, as is known, a black pigment that is then on the same side as the viewer. This configuration therefore has the advantage of attenuating the red reflection from the copper of the conducting element, the visual comfort of the viewer being further improved.

In this third embodiment, the tie sheet 22 and the backing sheet 31 do not need to be set back relative to the first substrate 20, and may have the same dimensions as the first substrate. The conducting element 30 also extends over the entire area of the backing sheet 31, and therefore right to the edges of the substrate 20. However, the covering sheet 24 is smaller in size, being set back toward the interior of the structure, so as to leave accessible a portion 32, preferably over the entire periphery, of the face 30a on the opposite side from the backing sheet 31. The second substrate 21, which is fastened to the covering sheet 24, has the dimensions of said sheet.

In a manner similar to the second embodiment, the connection means 40 are placed directly, via the rear, against the portion 32 of the face 30b of the conducting element. The alternative versions of the connection means 40 and of their application are also those described in the second embodiment.

In the fourth embodiment (FIG. 5), the conducting element 30 is deposited on the internal face of the first substrate 20, toward the interior of the structure, the conducting element being in the form of a metal coating, such as one based on silver. The structure includes a tie sheet 22 which allows the first substrate 20 to be joined to the second glass substrate if it is present (not illustrated here) or joined directly to the display. The structure may optionally include a covering sheet 24 made of plastic such as PVB, which makes it possible to provide a function other than the function fulfilled by the tie sheet 22, or to protect the tie sheet 22 if the latter is made of a material that can be easily scratched for example, and therefore to constitute a sheet for joining the structure to the second glass substrate if it is present (not illustrated here in FIG. 5), or else a sheet for joining the structure directly to the screen.

In this fourth embodiment, the sheets 22 and 24 are set back toward the interior of the structure so as to leave an exposed portion 32 accessible, preferably over the entire periphery, of the face 30b of the conducting element.

In a manner similar to the second and third embodiments, the connection means 40 are placed directly via the rear against the portion 32 of the face 30b of the conducting element. The alternative versions of the connection means 40 and of their application are also those described in the second embodiment, these being illustrated here by the mechanical clamping tabs 51.

As in the first embodiment, it should be noted that the substrate 20 of the three other embodiments is covered, over its entire periphery and on its internal face toward the interior of the structure, with a black enamel that allows all the electrical connections to be concealed.

Thus, according to the invention, at least one of the backing sheet 31 of the conducting element, the tie sheet 22 and the additional sheet 23 or the covering sheet 24, when one is present, is, at least on one of its sides, placed set back toward the interior of the structure relative to the associated free edge of the first substrate 20 so as to leave a portion 32 of the conducting element bare or exposed on at least one of the faces 30a or 30b thereof. The connection means 40 that connect the conducting element 30 to the electrical ground of the display are advantageously a flat conductor such as a busbar or a conductive foam tape that is connected to the exposed portion 32 of one of the faces 30a or 30b of the conducting element 30 by adhesive bonding or by mechanical clamping.

The connection means 40 are thus made independent of the conducting element 30, the shielding structure not needing to intrinsically include the electrical connection means, thereby making it easier to manufacture the shielding structure and the displays.

The invention claimed is:

1. An electromagnetic shielding structure, comprising:
   a conducting element;
   a transparent tie sheet mounted on said conducting element;
   a first transparent substrate mounted on said tie sheet;
   a backing sheet contacting a back portion of said conducting element;
   a plastic sheet which contacts said backing sheet;
   a second transparent substrate which contacts said plastic sheet; and
   an electrical connection member connected with said conductive element wherein at least one of said transparent tie sheet, said backing sheet, said plastic sheet and said second transparent substrate is set back with respect to at least one free edge portion of said substrate so as to form an exposed portion within which said electrical connection member is positioned and wherein said connection member comprises a substantially flat conductor which is connected to said exposed portion of said conducting element.

2. The electromagnetic shielding structure as claimed in claim 1, wherein only said transparent tie sheet is set back to form said exposed portion.

3. The electromagnetic shielding structure as claimed in claim 1, wherein each of said backing sheet, said sheet of plastic and said second transparent substrate are set back to form said exposed portion.

4. The electromagnetic shielding structure as claimed in claim 1, which comprises a frame within which said electrical connection member is positioned.

5. The electromagnetic shielding structure as claimed in claim 1, wherein an enamel covering is provided on one of substantially all of a peripheral portion of the first substrate and a free part of said first substrate.

6. The electromagnetic shielding structure as claimed in claim 1, wherein the conducting element comprises a silver-based metal layer.

7. The recapty structures claimed in claim 1, where in the conducting element comprises a mesh of conducting wires.

8. The structures claim in claimed 1, wherein the flat conductor comprises a bus bar or a conductive foam tape.

9. The structures claimed in claim 1, wherein the backing sheet is made of a plastic, PET, or material based on one of the following materials: Polycarbonate, polymethyl (meth) acrylate, polyethersulfone, polyether-kethone and styrene-acrylonitrile compolymers.

10. The structures claimed in claim 1, wherein the tie sheet, the additional sheet, and the covering sheet are made of one of a plastic, polyvinyl butyral, polyurethane, or ethylene-vinyl acetate.

11. The structures claimed in claim 1, the structure being joined to a front face of a display, and connected to an electrical ground of the display.

* * * * *